United States Patent [19]
Tseng et al.

[11] Patent Number: 5,820,689
[45] Date of Patent: Oct. 13, 1998

[54] WET CHEMICAL TREATMENT SYSTEM AND METHOD FOR CLEANING SUCH SYSTEM

[75] Inventors: Wen-Hsiang Tseng; B. J. Chang; Kuo-Liang Lu, all of Hsin-Chu, Taiwan

[73] Assignee: Taiwan Semiconductor Manufacturing Co., Ltd., Hsin-Chu, Taiwan

[21] Appl. No.: 767,117

[22] Filed: Dec. 4, 1996

[51] Int. Cl.⁶ .................. B08B 3/04; B08B 9/00; B08B 9/08; C23G 1/02
[52] U.S. Cl. .................. 134/3; 134/10; 134/25.4; 134/26; 134/28; 134/41; 134/104.1; 134/108; 134/111; 134/902
[58] Field of Search .................. 134/3, 10, 2, 25.4, 134/26, 28, 41, 104.1, 108, 111, 902

[56] References Cited

U.S. PATENT DOCUMENTS 4,302,273  11/1981  Howard, Jr. .................. 156/345
5,000,795  3/1991  Chung et al. .................. 134/37
5,190,065  3/1993  Kovac et al. .................. 134/107

Primary Examiner—Zeinab El-Arini
Attorney, Agent, or Firm—Tung & Associates

[57] ABSTRACT

A wet chemical treatment system for processing semiconductor wafers that does not have the problem of cracking or other damages occurring in the system during a cleaning process where a strong acid and water are mixed and pressure and heat are generated. The system includes an additional filing system such that only an outer tank for the processing liquid is filled after the system is cleaned so that pressure and heat generated by the reaction between acid and water can be released into an empty inner tank and thus avoiding damages caused by the heat and pressure. A method for cleaning such system is further disclosed.

20 Claims, 2 Drawing Sheets

WET CHEMICAL TREATMENT SYSTEM AND METHOD FOR CLEANING SUCH SYSTEM

FIELD OF THE INVENTION

The present invention generally relates to a wet chemical treatment system for processing semiconductor wafers and more particularly, relates to a wet chemical treatment system for processing semiconductor wafers that is equipped with a second filling means in fluid communication with a second passage means for filling a second tank such that the second tank may be filled with a processing liquid independently from a first tank and leaving the second tank empty so that pressure and heat generated during a cleaning process can be released into the second tank.

BACKGROUND OF THE INVENTION

Various techniques of etching resist-imaged photomasks, silicon wafers or other semiconductor materials have been used in semiconductor fabrication processes. A wet etching technique conducted in an immersion tank is a practical high-throughput, flexible fabrication process. By properly selecting etchant chemicals, etch reactions with the target film are thermodynamically favored over reactions with other films. Desirable etch-rate ratios can usually be obtained.

A wet etching method is especially suitable for the blanket etching of polysilicon, oxide, nitride and metal. The method is capable of providing the necessary etch selectivity, a damage-free interface and particle-contamination-free wafers. In more recently developed wet etching technology, automated robotic handling systems and ultra-pure chemicals have been used to further improve particle control and process consistency. A well-controlled wet etching technique is therefore the choice of etching process in VLSI and ULSI fabrication processes.

One of the key criteria in carrying out a wet etching process is that the etch products must be soluble in the etchant solution and therefore, no contaminating particles are generated. In an immersion etching process, the volume of the etching tank should be large enough to create enough pressure on the wafer surface in order to dislodge hydrogen gas bubbles evolved during etching reactions; to ensure an accurate balance of the etchant components; to keep the concentration of the etchant relatively constant; and to reduce the number of times the etchant tank must be changed in a production environment. An etchant bath change creates expensive down time, and furthermore, the handling of highly hazardous corrosive materials should be minimized from a safety standpoint.

Wet etching is a frequently used technique for stripping photoresist films from silicon wafers where a complete removal of the resist images without adversely affecting the wafer surface is desired. The resist layer or images should be completely removed without leaving any residues, including contaminant particles that may have been present in the resist. The underlying surface of the photoresist layer should not be adversely affected, for instance, undesirable etching of the metal or oxide surface should be avoided. Liquid etchant strippers should produce reasonable bath yield in order to prevent redeposition of dissolved resist on the wafers. The etchant should completely dissolve the photoresist layer in a chemical reaction, and not just lifting or peeling so as to prevent redeposition. It is also desirable that the etching or stripping time should be reasonably short in order to permit a high wafer throughput.

Sulfuric acid ($H_2SO_4$) and mixtures of $H_2SO_4$ with other oxidizing agents such as hydrogen peroxide ($H_2O_2$) are widely used in stripping photoresist or in cleaning a wafer surface after the photoresist has been stripped by other means. For instance, a frequently used mixture is seven parts $H_2SO_4$ to three parts of 30% $H_2O_2$, or a mixture of 88% sulfuric acid and 12% nitric acid. Wafers to be stripped can be immersed in the mixtures at a temperature between about 100° C. and about 150° C. for 5~10 minutes and then subjected to a thorough rinse by deionized water and dried by dry nitrogen. Inorganic chemical resist strippers, such as the sulfuric acid mixtures, are very effective in the residual-free removal of highly postbaked resist. They are more effective than organic strippers and the longer the immersion time, the cleaner and more residue-free wafer surface can be obtained.

A typical wet chemical treatment system 10 is shown in FIG. 1. The system has a wet chemical holding tank 12 comprises an inner tank 14 and an outer tank 16. As shown in FIG. 1, the inner tank 14 is usually positioned inside the outer tank 16 and that the sidewall 18 of the inner tank is lower than the sidewall 20 of the outer tank. This allows an operating mode where the inner tank is usually filled first with an etchant chemical through inlets 24 and 26. Inlet 26 to the inner tank 14 also serves as a drain and is connected to drain control valve 28 such that liquid can be drained through outlet 32. Similarly, outlet 34 is connected to the bottom of the outer tank 16 to drain the liquid etchant contained in the outer tank through a drain control valve 36 and the outlet 32.

The wet chemical treatment system 10 also includes a recirculating means 40 which has an inlet 42 for receiving a fluid from outlet 34 of the outer tank 16 through passageway 46, and an outlet 44 for feeding to filter means 50. A frequently used recirculating means suitable for the wet chemical treatment system is a mechanical pump that is specially outfitted for transporting corrosive fluids. In such a pump, any components that are in contact with the fluid being pumped is constructed of stainless steel, a corrosion-resistant polymeric material such as Teflon, or a metal coated with a corrosive-resistant polymeric material. The passage tubing 46, the drain control valves 28, 36, and the outlets 26, 34 are similarly constructed of corrosion-resistant materials.

The wet chemical treatment system 10 further includes a filter means 50 and a heater means 60. The liquid being pumped by the recirculating means 40 through outlet 44 and passage tubing 52 into inlets 54 and 56 of the filter means 50. The filter means 50 is capable of filtering out particulate contaminants in the wet chemical, especially those of metal particles, such that any contamination of the wafer situated in process tank 14 can be avoided. The filtered wet chemical exits the filter means at outlets 48 and 58 to enter into the heater means 60. In most wet chemical treatment processes, either for cleaning or for etching, the wet chemical can be more efficient in its cleaning or etching function when the temperature of the chemical is raised to above ambient temperature. For instance, for most etching and cleaning processes, a temperature of between about 100° C. and about 150° C. is found to be most suitable. The wet chemical enters the heater through inlet 62 and exits at outlet 66 to return the wet chemical to the inner tank 14 through inlets 24 and 26. The inner tank 14 can be filled with fresh chemicals when needed through a filling means 72 controlled by a fill control valve 74.

In the operation of a wet chemical treatment system 10 such as that shown in FIG. 1, the wet chemical contained in the inner tank 14 and the outer tank 16 must be replenished or replaced periodically in order to maintain its effectiveness for cleaning or etching. The auxiliary components, i.e., the recirculating means 40, the filler means 50 and the heater means 60 may also need to be disassembled and disconnected from the system either for replacement or for maintenance. In either situation, the wet chemical system 10 must be drained and then flushed with a solvent such as ionized water for cleaning. The procedure for such a draining and cleaning process for a typical wet chemical treatment system is shown in FIGS. 2 through 4.

In FIG. 2, it is shown that after the wet chemical contained in the inner and outer tanks is drained through the drain outlet 32, a cleaning solvent of ionized water is used to fill the system through filling means 72 and the fill control valve 74. After the inner tank 14 is filled to the top with ionized water, water overflows into the outer tank 16 to maintain a top water level 78. In a typical cleaning process, where system 10 is used as an etcher, approximately 45 liter of deionized water is filled into the system after the processing liquid has been drained away. The deionized water is normally heated to a temperature of approximately 120° C. and circulated for a time between about 1 and about 10 minutes. The water is then drained through outlet 32. This is shown in FIG. 3. When the inner tank and the outer tank are completely drained of the deionized water, there is always residual water left in the system that are trapped in passages 46, 52 and 62, in the recirculating means 40, in the filler means 50 and in the heater 60.

In the next step of the cleaning process, as shown in FIG. 4, fresh wet chemicals are added to the inner tank 14 through inlets 24 and 26, the filling means 72 and the fill control valve 74 such that it overflows into the outer tank 16. Since strong acid such as sulfuric acid or hydrofluoric acid is normally used as the wet chemical, acid reacts violently when it comes in contact and mix with the residual deionized water in passages 46 and 66. The drastic chemical reaction produces a high gaseous pressure and a large amount of heat due to the exothermic reaction between acid and water. The heat and pressure generated can cause cracking or deformation in the passages 46, 66 and in the tanks 14, 16. Any repair work made necessary by such damages in turn causes significant downtime of the wet chemical treatment system and severely affects its throughput.

In order to prevent such damages from occurring in the system, others have attempted various remedial efforts to prevent the occurrence of chemical reactions between acid and water. For instance, attempts have been made to disassemble all the auxiliary components such as the pump, the filter and the heater from the system during cleaning or maintenance. After the components are disassembled, the line can be completely drained and then blown dry by a dry nitrogen gas. The method, while capable of preventing chemical reactions from occurring between acid and water, causes other problems. Firstly, it is very time and labor consuming to disassemble all the components from the system for cleaning and then reassemble them to resume operation. Secondly, it is undesirable to blow dry components such as the filter means since ideally, the filter elements contained inside the filter means should be wet at all times. When the filter elements are blown dry by a drying gas, an additional step of pre-wetting the filter elements must be carried out before the filter means can be assembled back into the treatment system in order to prevent wetting problem and possibly trapped air. The method of disassembling all components for cleaning is therefore not economical or desirable.

It is therefore an object of the present invention to provide a wet chemical treatment system for processing semiconductor wafers that can be easily cleaned without the drawbacks and shortcomings of a conventional wet chemical treatment system.

It is another object of the present invention to provide a wet chemical treatment system for processing semiconductor wafers that does not need to be disassembled in order to carry out a cleaning process.

It is a further object of the present invention to provide a wet chemical treatment system for processing semiconductor wafers that only requires a minimal equipment modification in order to prevent damages from occurring in the system during a cleaning process.

It is another further object of the present invention to provide a wet chemical treatment system for processing semiconductor wafers that includes an additional filling means for filling an outer tank independently while maintaining an inner tank empty.

It is yet another object of the present invention to provide a wet chemical treatment system for processing semiconductor wafers in which only an outer tank is filled with a processing liquid after a cleaning process such that pressure and heat generated by reactions between acid and water can be released through an empty inner tank.

It is still another object of the present invention to provide a method of cleaning a wet chemical treatment system that does not have the problem of cracking or other damages occurring in the system caused by chemical reactions between acid and a cleaning solvent of water.

It is still another further object of the present invention to provide a method of cleaning a wet chemical treatment system by providing a direct feeding line to an outer tank for filling a processing liquid after the system has been drained and cleaned while maintaining an inner tank empty such that pressure and heat generated upon mixing of acid and water can be released through the inner tank.

SUMMARY OF THE INVENTION

The present invention provides a wet chemical treatment system for processing semiconductor wafers that does not have the problem of cracking or other damages occurring during a cleaning process of the system.

In a preferred embodiment, the wet chemical treatment system for processing semiconductor wafers includes a first tank and a second tank for holding a processing liquid respectively, the first tank is isolated from the second tank except that the first tank when full overflows into the second tank; a first passage for providing fluid communication to the first tank, a second passage for providing fluid communication to the second tank; a recirculating pump connected between the first passage and the second passage; a first filling tube in fluid communication with the first passage for filling the first tank; and a second filling tubing in fluid communication with the second passage tubing for filling the second tank such that the second tank can be filled with a processing liquid independently from the first tank while maintaining the second tank empty for releasing pressure and heat generated in the first and the second passages upon mixing of the processing liquid and a cleaning solvent.

The present invention is further directed to a method of cleaning a wet chemical treatment system for processing semiconductor devices that includes the steps of first providing a first tank and a second tank for holding a processing liquid respectively, the first tank is isolated from the second tank except that the first tank when full overflows into the second tank; providing a first passage for providing fluid communication to the first tank and a second passage for providing fluid communication to the second tank; providing a first filling tube in fluid communication with the first passage and a second filling tube in fluid communication with the second passage tubing, providing a plurality of valves for opening and closing the first, the second passage and the first, the second filling tube; providing a drain in fluid communication with the first and the second passage; emptying the treatment system including the first and the second tank, the first and second passage, and the first and the second filling tube through the drain; filling the system with a cleaning solvent and circulating the solvent through the system; exhausting from the system the cleaning solvent through the drain; filling the first tank with a processing liquid through the first filling tube while maintaining the second tank empty; circulating the processing liquid through the first and the second passage such that pressure and heat generated upon mixing of the processing liquid with the residual cleaning solvent in the first and the second passage is released through the empty second tank.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a wet chemical treatment system for processing semiconductor wafers that does not have the problem of cracking or other damages occurring during a cleaning process upon mixing of acid and water and a method for cleaning such system.

Figure 1:
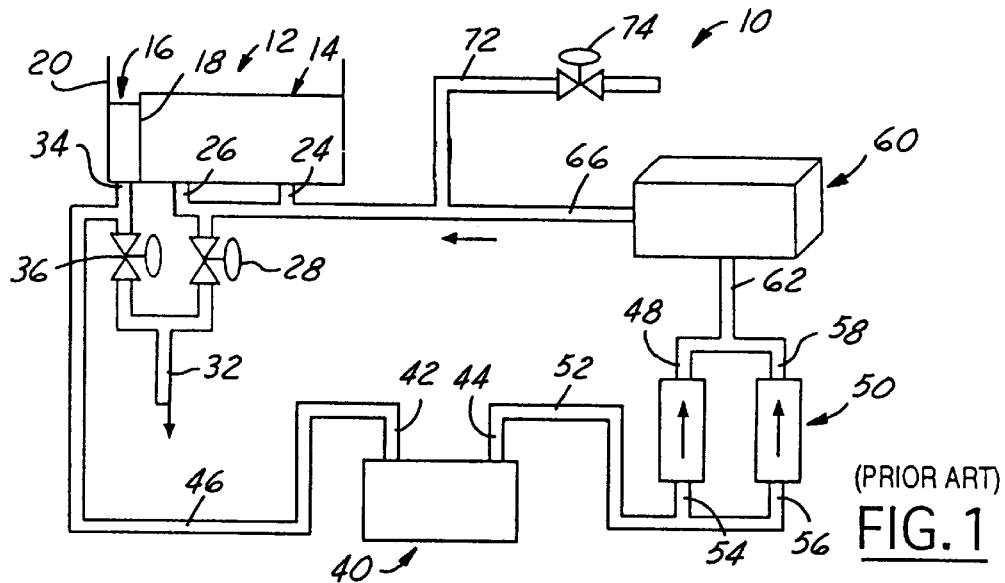
FIG. 1 is a schematic showing a conventional wet chemical treatment system with no processing liquid or cleaning solvent in the system.
Figure 2:
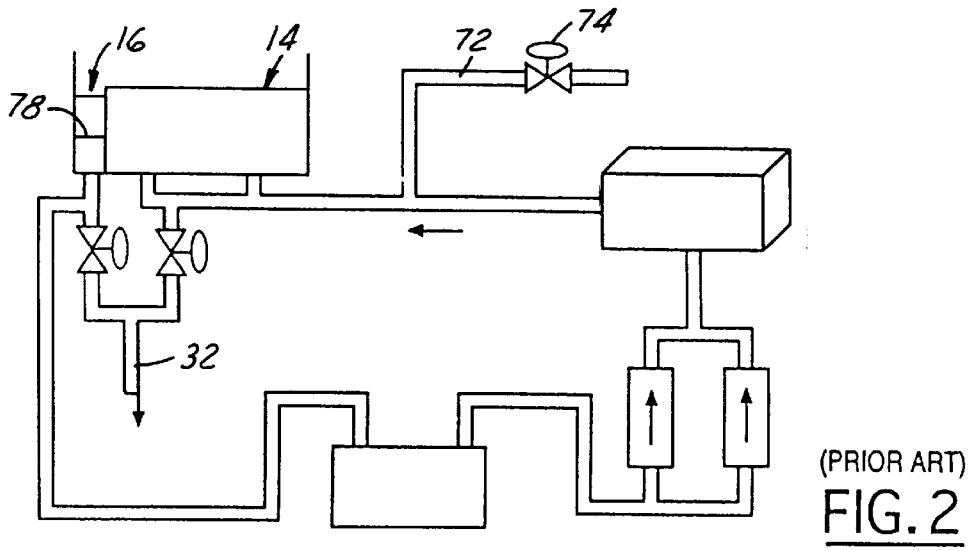
FIG. 2 is a schematic showing a conventional wet chemical treatment system that is filled with a cleaning solvent.
Figure 3:
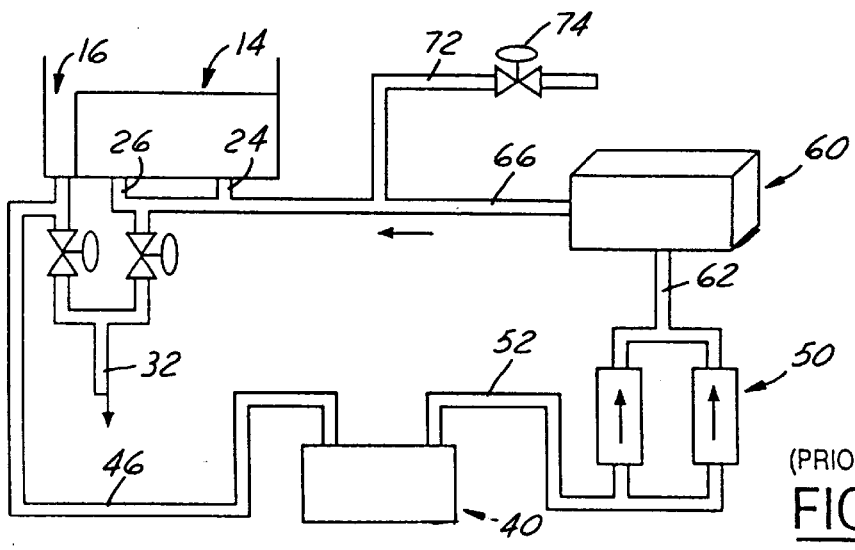
FIG. 3 is a schematic of a conventional wet chemical treatment system with the cleaning solvent drained from the inner and the outer tank.
Figure 4:
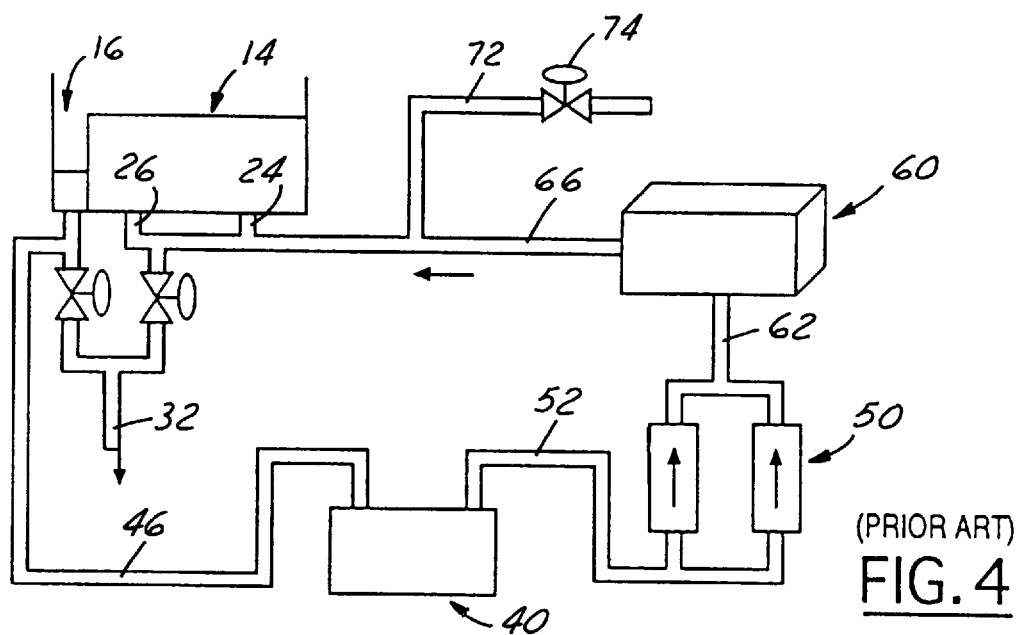
FIG. 4 is a schematic showing a conventional wet chemical treatment system refilled with a processing liquid after a cleaning process.
Figure 5:
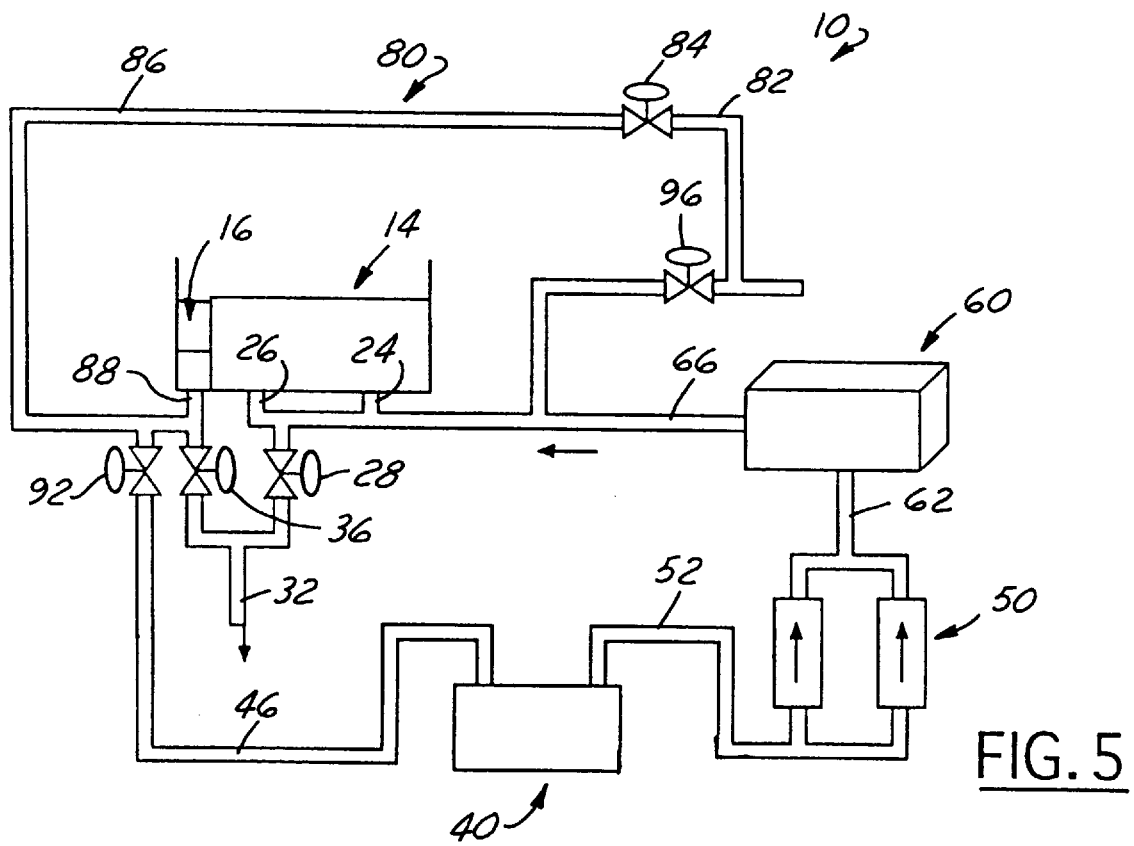
FIG. 5 is a present invention wet chemical treatment system incorporating an additional filling means for filling the outer tank directly with a processing liquid.

Referring now to FIG. 5 which illustrates a preferred embodiment of the present invention. It is seen that a second filling means 80 is added to the wet chemical treatment system 10. The second filling means 80 includes an inlet 82 for a processing liquid, a control valve 84 for turning on or off the fluid passage through tubing 86, and inlet 88 to the outer tank 16. The inlet 88 also serves as an outlet for the processing liquid when drained from the outer tank 16 through control valve 36 and outlet 32. During the filling process of the outer tank 16, the control valves 92 and 36 are closed such that processing liquid only enters into the outer tank 16. After a desirable amount of the processing liquid such as a strong acid of sulfuric acid or hydrofluoric acid has been added to the outer tank 16, the control valve 92 is opened and the recirculating means 40 is switched on to circulate the processing liquid through system 10. Since valve 96 is closed during the filling of the outer tank 16 with the processing liquid, passage 66 is usually empty and thus no chemical reaction between the processing liquid and the cleaning solvent, i.e., water can occur. When the recirculating means 40 is first switched on, chemical reaction occurs in passage 46 where the processing liquid of acid and the cleaning solvent of deionized water is mixed causing a violent reaction. The gaseous pressure and the exothermic heat generated in the passage 46 enters through inlet 24, 26 and releases into the empty inner tank 14. The problem that has been observed in a conventional wet chemical treatment system during a cleaning process can therefore be completely prevented. Since there is no processing liquid or cleaning solvent left in the inner tank 14 after the draining process, the empty tank 14 is used for releasing the gas pressure and heat generated in the passage and in the auxiliary component.

The present invention method for cleaning a wet chemical treatment system can be described as follows. First, a second filling means 80 is added to the system 10 such that processing liquid of a strong acid can be filled into the outer tank 16 only while the inner tank 14 is kept empty. The filling of the outer tank 16 is conducted after the system has been first purged with deionized water and then drained off the deionized water leaving the inner tank and the outer tank empty. The cleaning solvent of deionized water required for filling the system (as shown in FIG. 5) is approximately 45 liters and for effective cleaning the water should be heated to a temperature of between about 100° C. and about 150° C. and circulated for between about 1 and 20 minutes.

After the cleaning solvent of deionized water is drained from the system through drain outlet 32, a suitable amount of the processing liquid of a strong acid is added to the system through the novel filling means 80 such that only the outer tank 16 is filled with the acid. During the filling process, the control valve 92 to the system and the control valve 36 to the drain outlet are both closed. After the outer tank 16 is filled to a suitable level, the control valve 92 is opened and the recirculating means 40 is turned on such that the acid, and any residual cleaning solvent of water, can be circulated in the system. Any gaseous pressure and exothermic heat generated by the reaction between acid and water in the passages 46, 52, 62, 66 and in the auxiliary components 40, 50 and 60 are released into the empty inner tank 14. The present invention novel method of cleaning a wet chemical treatment system therefore does not cause any trapped pressure and heat in an enclosed system such as that frequently occurring in the conventional system and therefore, the system cannot be damaged by such pressure and heat.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

We claim:

1. A wet chemical treatment system for processing semiconductor wafers comprising:

a first tank and a second tank for holding a processing liquid, respectively, said first tank being isolated from said second tank except that said first tank when full overflows into said second tank;

a first passage means for providing fluid communication to said first tank;

a second passage means for providing fluid communication to said second tank;

a recirculating means connected between said first passage means and said second passage means;

a first filling means in fluid communication with said first passage means for filing said first tank; and a second filling means in fluid communication with said second passage means for filling said second tank such that said second tank may be filled with a processing liquid independently from said first tank while maintaining said second tank empty for releasing pressure and heat generated in said first and said second passage means.

2. A wet chemical treatment system according to claim 1 further comprising filter means connected in series with said recirculation means and said first passage means.

3. A wet chemical treatment system according to claim 1 further comprising heating means connected in series with said recirculating means and said first passage means.

4. A wet chemical treatment system according to claim 1, wherein said second tank is situated inside said first tank.

5. A wet chemical treatment system according to claim 1, wherein said second tank is an inner tank and said first tank is an outer tank.

6. A wet chemical treatment system according to claim 1, wherein said processing liquid is a corrosive fluid.

7. A wet chemical treatment system according to claim 1, wherein said recirculating means is a pump.

8. A wet chemical treatment system according to claim 1 further comprising valve means for opening and closing said first passage means and said second passage means.

9. A wet chemical treatment system according to claim 1 further comprising valve means for opening and closing said first filling means and said second filling means.

10. A wet chemical treatment system according to claim 1, wherein said processing liquid is an acid.

11. A method of cleaning a wet chemical treatment system for processing semiconductor devices comprising the steps of:

providing a first tank and a second tank for holding a processing liquid respectively, said first tank being isolated from said second tank except that said first tank when fill overflows into said second tank;

providing a first passage means for providing fluid communication to said first tank and a second passage means for providing fluid communication to said second tank;

providing a first filling means in fluid communication with said first passage means and a second filling means in fluid communication with said second passage means;

providing a plurality of valve means for opening and closing said first, said second passage means and said first, said second filling means;

providing a draining means in fluid communication with said first and said second passage means;

emptying said treatment system including said first and said second tank, said first and said second passage means, and said first and said second filling means by said draining means;

filling said treatment system with a cleaning solvent and circulating said cleaning solvent through said treatment system;

exhausting from said treatment system said cleaning solvent by said draining means;

filling said first tank with said processing liquid through said first filling means while maintaining said second tank empty; and circulating said processing liquid through said first and said second passage means such that pressure and heat generated upon mixing of said processing liquid with any residual cleaning solvent in said first and said second passage means is released into said empty second tank.

12. A method of cleaning a wet chemical treatment system according to claim 11, wherein said processing liquid is a corrosive fluid.

13. A method of cleaning a wet chemical treatment system according to claim 11, wherein said cleaning solvent is water.

14. A method of cleaning a wet chemical treatment system according to claim 11 further comprising the steps of filling and exhausting a recirculating means connected in series with said first and said second passage means with a cleaning solvent.

15. A method of cleaning a wet chemical treatment system according to claim 14, wherein said recirculating means is a pump.

16. A method of cleaning a wet chemical treatment system according to claim 11 further comprising the steps of filling and exhausting a recirculating means, a filter means and a heater means connected in series with said first and said second passage means with a cleaning liquid.

17. A method of cleaning a wet chemical treatment system according to claim 11, wherein said pressure and heat is generated by a chemical reaction between a processing liquid of acid and a cleaning solvent of deionized water.

18. A method of cleaning a wet chemical treatment system according to claim 11, wherein said processing liquid is sulfuric acid.

19. A wet chemical etch tank for processing silicon wafers comprising:

an inner tank and an outer tank for holding a processing liquid, respectively, said inner tank being isolated from said outer tank except that said outer tank when full overflows into said inner tank;

a first passage means for providing fluid communication to said inner tank;

a second passage means for providing fluid communication to said outer tank;

a pump means, a filter means and a heater means connected in series between said first passage means and said second passage means;

a first filling means in fluid communication with said first passage means for filing said inner tank; and a second filling means in fluid communication with said second passage means for filling said outer tank such that said outer tank can be filled independently with a processing liquid while said inner tank is kept empty for releasing pressure and heat generated in said first and said second passage means by a reaction between said processing liquid and a cleaning solvent.

20. A wet chemical etch tank according to claim 19 further comprising a plurality of valve means for opening and closing said first and said second passage means, and said first and said second filling means.

* * * * *